(12) United States Patent
Eusterholz

(10) Patent No.: US 11,272,633 B2
(45) Date of Patent: Mar. 8, 2022

(54) ELECTRONIC DEVICE HAVING A PRINTED CIRCUIT BOARD

(71) Applicant: Phoenix Contact GmbH & Co. KG, Blomberg (DE)

(72) Inventor: Helmut Eusterholz, Paderborn (DE)

(73) Assignee: PHOENIX CONTACT GMBH & CO. KG, Blomberg (DE)

( * ) Notice: Subject to any disclaimer, the term of this patent is extended or adjusted under 35 U.S.C. 154(b) by 0 days.

(21) Appl. No.: 16/769,255

(22) PCT Filed: Dec. 4, 2018

(86) PCT No.: PCT/EP2018/083539
§ 371 (c)(1),
(2) Date: Jun. 3, 2020

(87) PCT Pub. No.: WO2019/110612
PCT Pub. Date: Jun. 13, 2019

(65) Prior Publication Data
US 2021/0185842 A1  Jun. 17, 2021

(30) Foreign Application Priority Data

Dec. 8, 2017 (BE) .................................. 2017/5921
Dec. 8, 2017 (DE) ..................... 10 2017 129 288.8

(51) Int. Cl.
*H05K 1/14* (2006.01)
*H05K 7/14* (2006.01)
(Continued)

(52) U.S. Cl.
CPC .......... *H05K 7/1418* (2013.01); *G06F 1/181* (2013.01); *G06F 1/183* (2013.01); *H01R 9/2658* (2013.01);
(Continued)

(58) Field of Classification Search
USPC ........................................................ 361/740
See application file for complete search history.

(56) References Cited

U.S. PATENT DOCUMENTS 5,791,916 A    8/1998  Deinhardt et al.
7,068,516 B2 * 6/2006  Chan .................... H05K 5/0008
                                                   361/731
(Continued)

FOREIGN PATENT DOCUMENTS

DE      8805257 U1   6/1988
DE      4428687 C1   8/1995
(Continued)

*Primary Examiner* — Hung S. Bui
(74) *Attorney, Agent, or Firm* — Leydig, Voit & Mayer, Ltd.

(57) ABSTRACT

An electronic device includes: a housing which has two side walls which are spaced apart from one another along an apposition direction and form an accommodation space between them; a printed circuit board which is insertable into the accommodating space of the housing along an insertion direction pointing transversely to the apposition direction and, in a mounting position, is accommodated in the accommodating space in a position perpendicular to the apposition direction and has a side edge extending along the insertion direction; and at least one attachment part which has at least one engagement receptacle by which the at least one attachment part is attachable to the side edge of the printed circuit board and, in an attached position, is connected to the printed circuit board.

15 Claims, 12 Drawing Sheets

(51) Int. Cl.
*G06F 1/18* (2006.01)
*H01R 9/26* (2006.01)
*H01R 12/72* (2011.01)
*H01R 13/504* (2006.01)
*H01R 13/514* (2006.01)
*H05K 5/00* (2006.01)

(52) U.S. Cl.
CPC ....... *H01R 12/724* (2013.01); *H01R 13/5045* (2013.01); *H01R 13/514* (2013.01); *H05K 5/0073* (2013.01); *H05K 7/1402* (2013.01)

(56) References Cited

U.S. PATENT DOCUMENTS

| | | | |
|---|---|---|---|
| 7,495,931 B2 * | 2/2009 | Clark | H05K 7/1425 361/790 |
| 7,817,412 B2 * | 10/2010 | Sullivan | G06F 1/16 361/679.33 |
| 8,506,324 B2 * | 8/2013 | Naufel | H01R 12/7082 439/541.5 |
| 2009/0207571 A1 | 8/2009 | Boensch et al. | |
| 2011/0299246 A1 | 12/2011 | Brokmann et al. | |

FOREIGN PATENT DOCUMENTS

| | | |
|---|---|---|
| DE | 19514767 C1 | 5/1996 |
| DE | 102006034164 A1 | 11/2007 |
| DE | 202008002113 U1 | 6/2009 |
| DE | 102014104368 A1 | 10/2015 |
| EP | 0235320 A1 | 9/1987 |
| EP | 2399435 B1 | 4/2015 |

\* cited by examiner

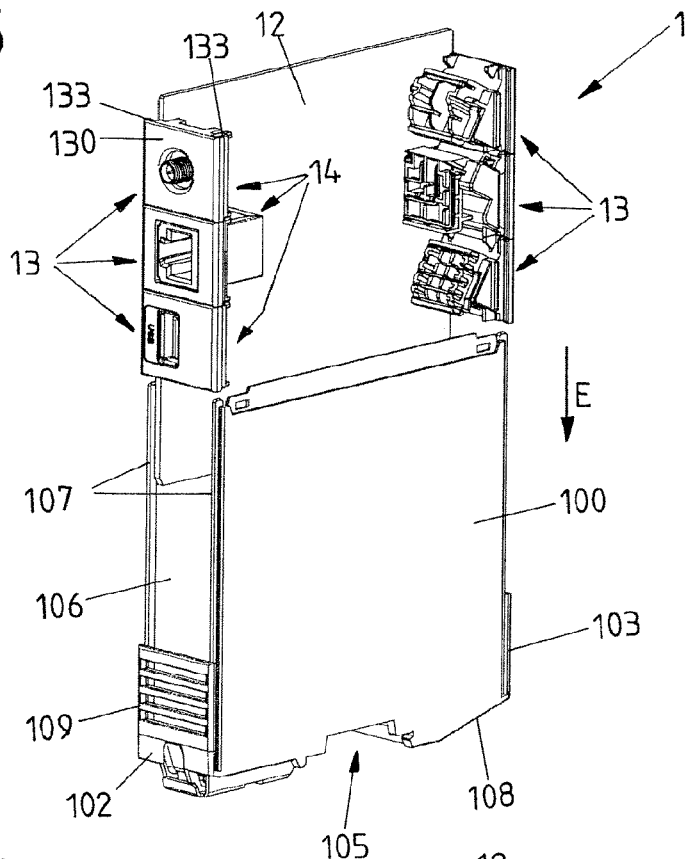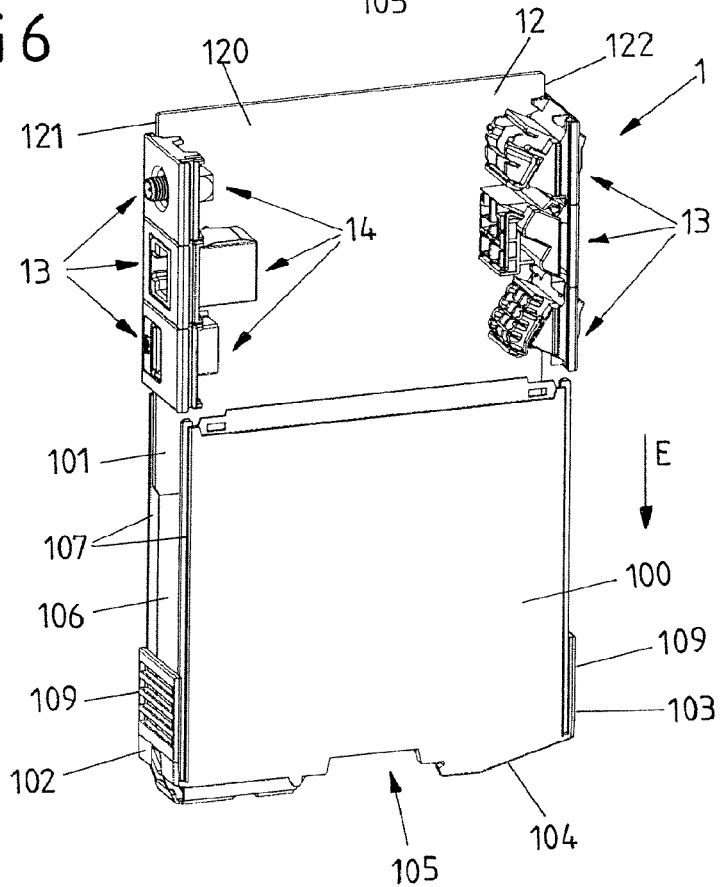

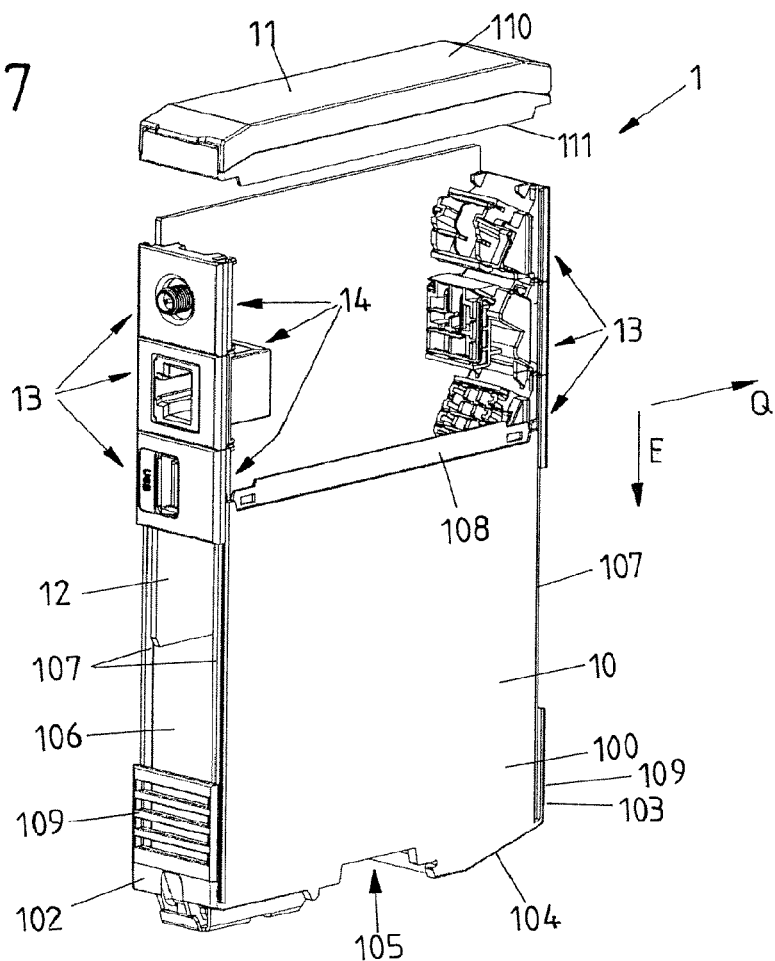
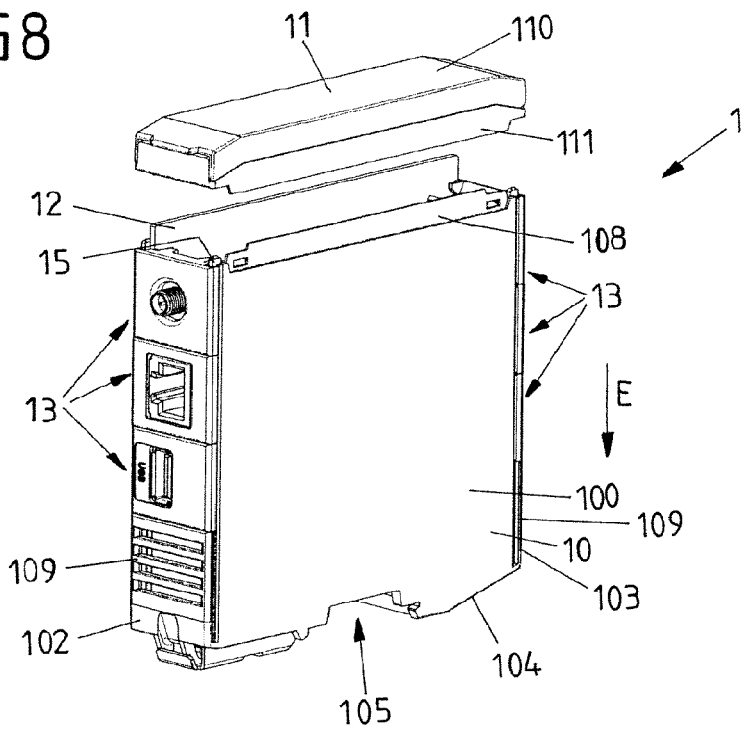

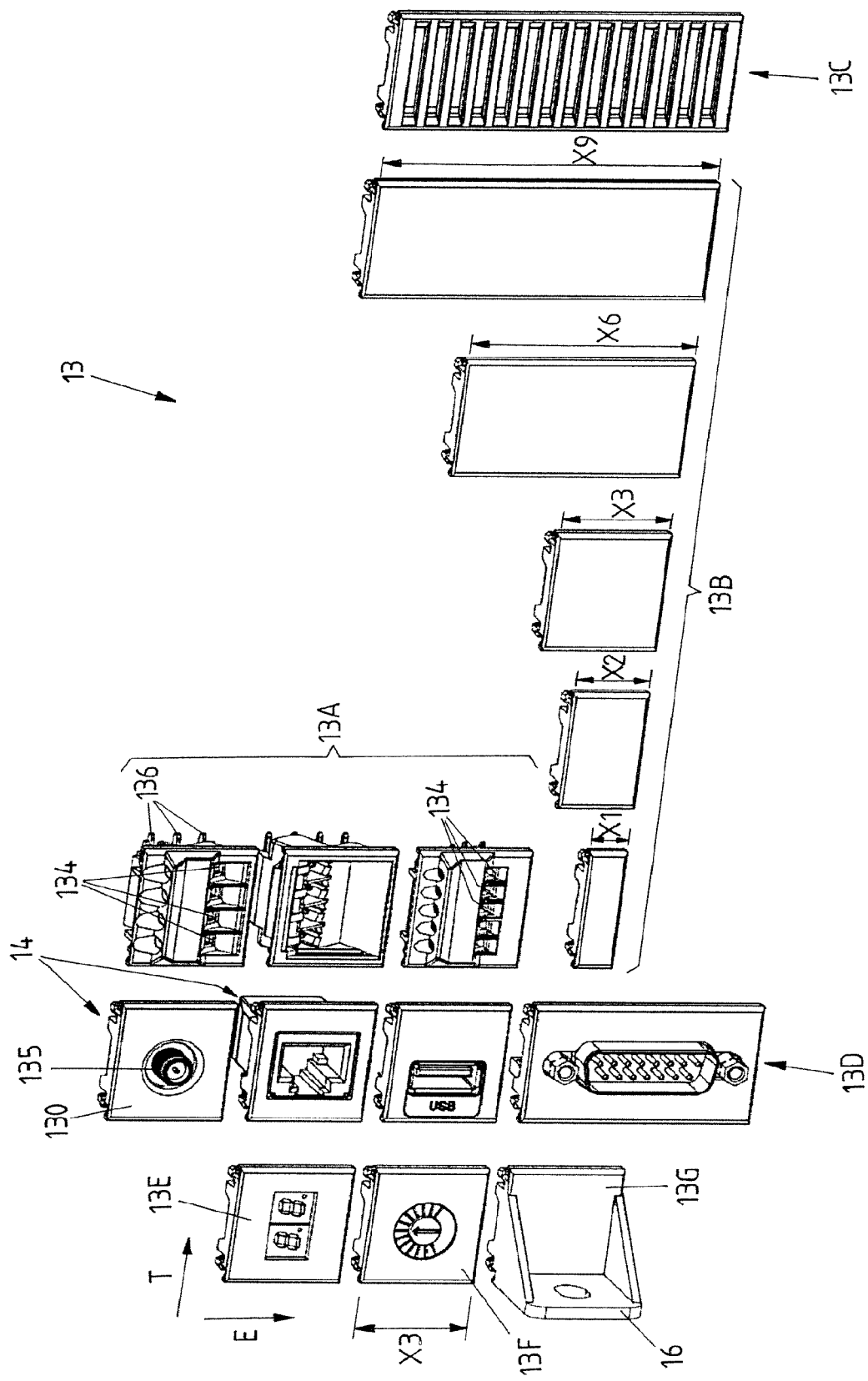

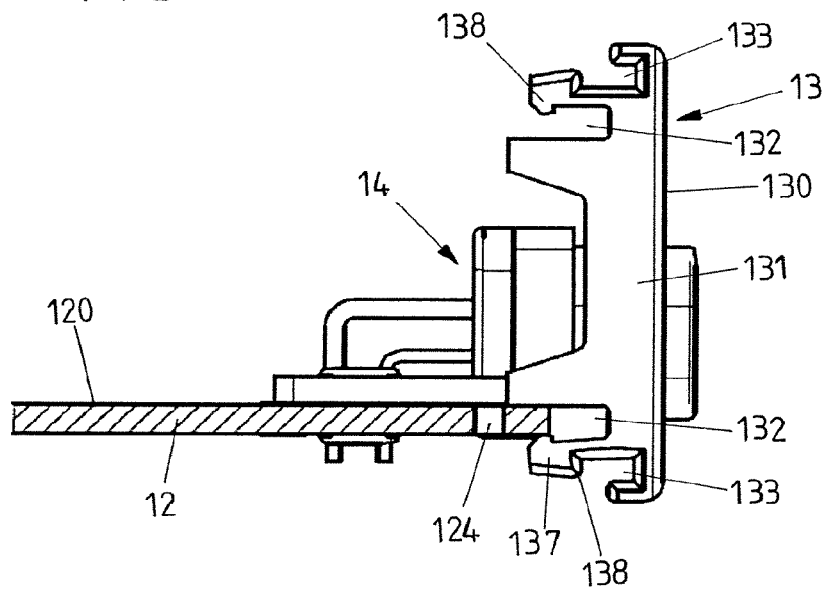
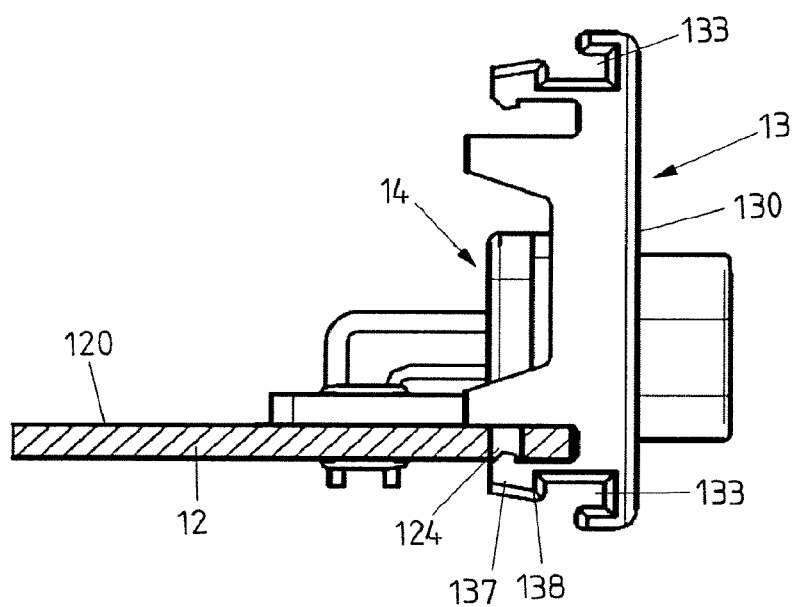

ELECTRONIC DEVICE HAVING A PRINTED CIRCUIT BOARD

CROSS-REFERENCE TO PRIOR APPLICATIONS

This application is a U.S. National Phase application under 35 U.S.C. § 371 of International Application No. PCT/EP2018/083539, filed on Dec. 4, 2018, and claims benefit to Belgian Patent Application No. BE 2017/5921, filed on Dec. 8, 2017, and to German Patent Application No. DE 10 2017 129 288.8, filed on Dec. 8, 2017. The International Application was published in German on Jun. 13, 2019 as WO 2019/110612 under PCT Article 21(2).

FIELD

The invention relates to an electronic device and to a method for producing an electronic device.

BACKGROUND

Such an electronic device comprises a housing which has two side walls which are spaced apart from one another along an apposition direction and form an accommodating space between them. A printed circuit board having a side edge extending along the insertion direction can be inserted into the accommodating space of the housing along an insertion direction pointing transversely to the apposition direction and is accommodated in the accommodating space in a mounting position in a position extending perpendicularly to the apposition direction.

Such an electronic device can, for example, be combined with other electronic devices along the apposition direction so that a plurality of electronic devices are arranged next to one another along the apposition direction. The electronic device can, for example, be accommodated together with the other electronic devices on a support rail so that in this way, an electrical assembly is created which, for example, can assume control or evaluation functions within the framework of an industrial installation.

Arranged on the printed circuit board are in this case electronic components which can be inserted into the housing in order to form the electronic device. In the mounting position, the printed circuit board extends in parallel to the side walls, between which the accommodating space is formed, and is enclosed in the housing in a protected manner.

Desirable is an electronic device which can be mounted easily, in particular in order to insert and fix the printed circuit board in the housing, but can also be populated variably, for example with connections or indicator and operating elements, depending on the design of electronic components of the printed circuit board.

In an electronic device known from DE 44 28 687 C1, a printed circuit board, together with a housing part preassembled on operating elements of the printed circuit board, can be inserted into a housing. In the mounted position, the housing part closes an opening of the housing.

In an electronic device known from EP 2 399 435 B1, housings with connection chambers are pre-assembled on a printed circuit board. The printed circuit board can then be arranged together with side parts on a housing base in order to complete the electronic device.

SUMMARY

In an embodiment, the present invention provides an electronic device, comprising: a housing which has two side walls which are spaced apart from one another along an apposition direction and form an accommodation space between them; a printed circuit board which is insertable into the accommodating space of the housing along an insertion direction pointing transversely to the apposition direction and, in a mounting position, is accommodated in the accommodating space in a position perpendicular to the apposition direction and has a side edge extending along the insertion direction; and at least one attachment part which has at least one engagement receptacle by which the at least one attachment part is attachable to the side edge of the printed circuit board and, in an attached position, is connected to the printed circuit board.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

FIG. 5 a view of the electronic device during assembly;

FIG. 6 another view of the electronic device during assembly;

FIG. 7 a view of the electronic device during the further assembly;

FIG. 8 a view of the electronic device prior to completion by a housing cover;

FIG. 9 a view of different exemplary embodiments of attachment parts of a modular system;

FIG. 13 a sectional view of another exemplary embodiment of a printed circuit board when attaching the attachment part;

FIG. 14 the sectional view of FIG. 13 with attached attachment part;

DETAILED DESCRIPTION

Figure 1:
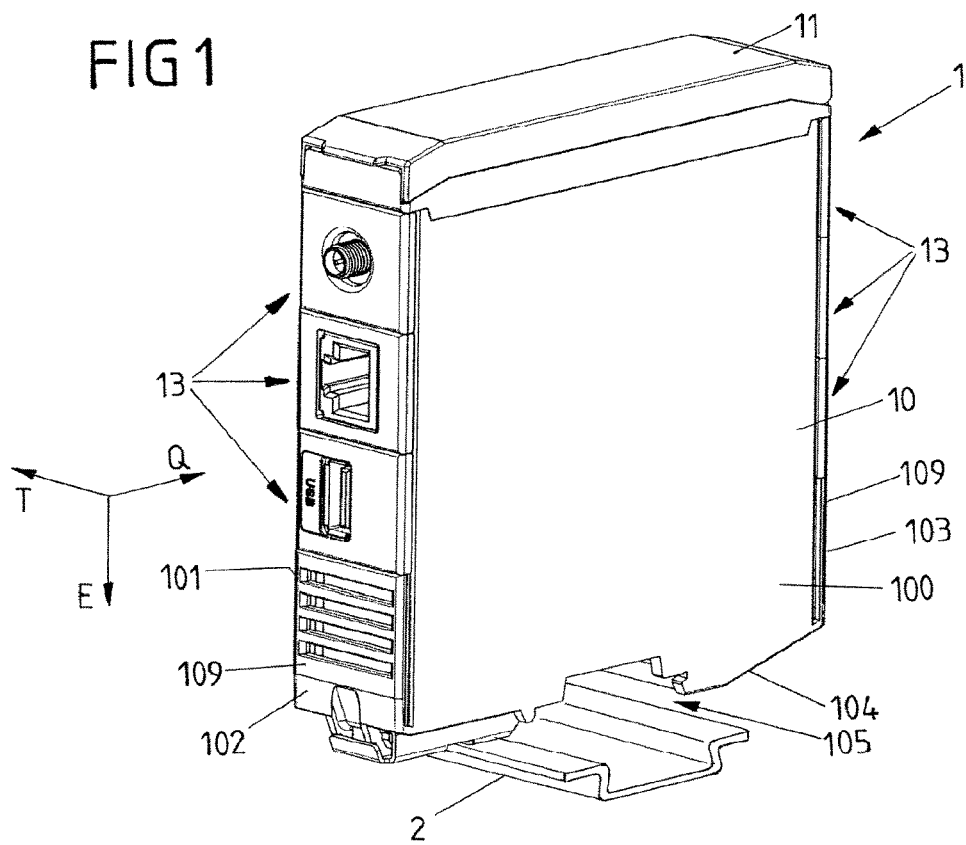
FIG. 1 a perspective view of an exemplary embodiment of an electronic device.

In an embodiment, the present invention provides an electronic device and a method for producing an electronic device which can be configured as a function of the application, which device and method enable simple and thus cost-effective assembly of the electronic device with variable populatability, in particular with electrical and/or mechanical connections.

Accordingly, at least one attachment part has at least one engagement receptacle, by means of which the at least one attachment part can be attached to the side edge of the printed circuit board and, in an attached position, is connected to the printed circuit board.

The at least one attachment part is thus attached with the engagement receptacle to the side edge of the printed circuit board and is held, in particular, non-positively or positively on the printed circuit board.

Attachment parts which, in the assembled position, are connected non-positively or positively to the printed circuit board can thus be attached to the printed circuit board in a modular manner. For this purpose, the attachment parts each have an engagement receptacle, by means of which the attachment parts can be attached to a side edge of the printed circuit board and which can be formed, for example, in the shape of a slot for receiving the side edge of the printed circuit board. Functional assemblies can be provided on the printed circuit board by means of such attachment parts. As described below, the attachment parts can also serve to connect the printed circuit board to the housing and, in the mounting position, complete the housing in such a way that the accommodating space in which the printed circuit board is accommodated is closed to the outside. For this purpose, the attachment parts can form a positive connection with the side walls of the housing.

The attachment parts being non-positively or positively connected to the printed circuit board by engagement of the engagement receptacle with an associated side edge of the printed circuit board results in easy mounting for which the attachment parts have to be attached (merely) to an associated side edge of the printed circuit board. In doing so, different attachment parts can be combined with one another in order to populate the printed circuit board with a suitable combination of attachment parts according to the desired function and design.

The engagement receptacle of the attachment part can, for example, be formed on a web of the attachment part protruding from a body and be designed in the shape of a slot. The printed circuit board with its side edge is inserted into the engagement receptacle in order to non-positively or positively connect the attachment part to the printed circuit board.

In order to establish a positive connection, the attachment part can have, for example, a latching hook which is deformed (slightly) when the attachment part is attached to the printed circuit board and snaps into an associated latching opening of the printed circuit board after the attached position is reached. By means of such a latching hook and its engagement in the latching opening of the printed circuit board, the attachment part is thus secured to the printed circuit board in such a way that the attachment part cannot readily be removed from the printed circuit board, at least not without releasing the latching.

In order to produce a non-positive connection, the engagement receptacle can, for example, form an interference fit with the associated side edge of the printed circuit board in that the (slot-shaped) engagement receptacle has a clear width which is smaller than the thickness of the printed circuit board in the region of the side edge or a narrowing in the engagement receptacle is formed by a fixing lug. A non-positive connection is thus produced when the attachment part is attached to the printed circuit board.

In one embodiment, the attachment part has a plurality of engagement receptacles, spaced apart from one another transversely to the insertion direction, for connecting the attachment part to a plurality of printed circuit boards which extend in parallel to one another and are to be inserted into the housing. By means of the attachment part, a plurality of printed circuit boards can thus be connected to one another and held in a defined position relative to one another.

In a specific embodiment, the attachment part can have two (groups of) engagement receptacles which are offset in relation to one another transversely to the insertion direction and by means of which the attachment part can be connected to two printed circuit boards aligned in parallel to one another.

By connecting one or more attachment parts to one or more printed circuit boards, a pre-assembled structural unit is created, which as such can be inserted into the accommodating space of the housing. If a plurality of printed circuit boards are provided, the printed circuit boards can be connected to one another and held in a defined position relative to one another by means of the attachment parts so that the printed circuit boards can be inserted together into the accommodating space of the housing.

In one embodiment, the printed circuit board has side edges which extend along the insertion direction and are opposite one another and on which attachment parts can be arranged. The attachment parts are thus arranged next to one another on opposite side edges of the printed circuit board and combined with one another so that the attachment parts extend along the side edges of the printed circuit board in a state connected to the printed circuit board.

In one embodiment, the attachment parts each have two first guide devices for guiding on second guide devices of the side walls of the housing. The attachment parts can be mounted together with the printed circuit board on the housing such that, when the printed circuit board is inserted into the accommodating space, the attachment parts are guided displaceably by means of the first guide devices on the second guide devices of the side walls of the housing along the insertion direction and, in the mounting position, positively connect the side walls to one another.

One or more attachment parts may be pre-assembled on the printed circuit board in order to insert the printed circuit board together with the attachment parts arranged thereon into the housing. In the pre-assembled position, the attachment parts are connected to the printed circuit board and thus together with the printed circuit board form a pre-assembled structural unit which can be attached to the housing of the electronic device. This pre-assembled structural unit is then attached in a guided manner, in accordance with an advantageous embodiment, in that first guide devices of the attachment parts are brought into engagement with second guide devices of the side walls of the housing so that the structural unit, i.e., the attachment parts together with the printed circuit board, can be inserted into the housing and the printed circuit board reaches a defined position within the accommodating space. In the mounting position, the attachment parts fix the printed circuit board in the accommodating space in that the printed circuit board is connected to the side walls by means of the attachment parts. Here, the attachment parts extend between the side walls and positively connect the side walls to one another so that the housing is completed and the attachment parts, for example, close the housing to the outside.

Any desired attachment parts for providing quite different functions can be attached to the printed circuit board. Depending on a desired configuration and function of the electronic assembly provided by the printed circuit board, the printed circuit board can thus be populated with different attachment parts in order to insert the pre-assembled structural unit created in this way into the housing and thereby mount the electronic device.

For mounting, the first guide devices of the attachment parts and the second guide devices of the side walls of the housing can preferably be brought into engagement with one another in such a way that the attachment parts are firmly connected to the side walls in a plane extending perpendicularly to the insertion direction but are displaceable along the insertion direction in relation to the side walls until the mounting position is reached and the printed circuit board additionally latches in the reached end position in the housing, for example. The attachment parts are thus secured in relation to the side walls in the plane extending perpendicularly to the insertion direction, i.e., they are connected to the side walls such that there is a fixed connection between the attachment parts and the side walls, but the attachment parts are displaceable along the insertion direction in relation to the side walls until the mounting position is reached. The engagement of the first guide devices with the second guide devices thus creates a guide for the attachment parts on the side walls, on the basis of which the attachment parts and moreover the printed circuit board can be displaced in a defined manner in relation to the side walls without the attachment parts being able to readily release from their guided engagement with the side walls.

The guidance of the attachment parts on the side walls can be provided, for example, in that each first guide device can be brought into positive engagement with an associated second guide device by establishing an engagement of a web in a groove in the sense of a tongue and groove connection. One of the guide devices thus has a web which engages in an associated groove of the other guide device and thereby provides guidance along the insertion direction but at the same time interconnects the attachment parts in the plane perpendicular to the insertion direction such that the engagement between the attachment parts and the side walls is not readily releasable.

In a specific embodiment, the second guide devices of the side walls each have a web, while the first guide devices of each attachment part each have a groove which can be brought into engagement with the web. Each attachment part thus has two grooves which can be brought into engagement with a web of each side wall so that the attachment part is guided displaceably on both side walls, but a not readily releasable connection is created between the attachment part and the side walls so that the attachment part is positively secured in relation to the side walls in a plane extending perpendicularly to the insertion direction.

In an alternative embodiment, it is also conceivable that the first guide devices of the attachment parts each have a web and the second guide devices of the side walls each have a groove with which a web of an associated first guide device can be brought into engagement.

In another embodiment, it is also conceivable for the guide system to be embodied as an entire or half a dovetail guide with an inclined groove-web system.

The positive connection between the guide devices is in particular such that the attachment parts are secured in relation to the side walls in a plane extending perpendicularly to the insertion direction and a connection is thus created between the attachment parts and the side walls. In order to prevent an attachment part from coming out of engagement with an associated web along a transverse direction which extends transversely to the apposition direction and transversely to the insertion direction, a blocking web can be arranged in the region of the groove, which blocking web blocks the web in the groove and prevents the web from slipping out of the groove along the transverse direction. The web can, for example, engage in the groove in an engagement direction pointing along the transverse direction. The blocking web blocks the web from sliding out of the groove counter to the engagement direction and thus ensures the engagement of the web in the groove.

In order to connect the attachment parts firmly to the side walls in a plane extending perpendicularly to the insertion direction (but displaceably along the insertion direction in relation to the side walls up to the mounting position), the groove preferably encompasses the guide web on four sides. Steps which the guide web forms with the associated side wall are in contact with the blocking web and a boundary section of the groove. The guide web is thus positively held in engagement with the groove and cannot be moved out of the groove in a plane perpendicular to the insertion direction.

In one embodiment, the attachment parts extend in the mounting position along the apposition direction between the side walls. The attachment parts can extend, for example, planarly along the apposition direction and the insertion direction and can, for example, provide a boundary of the accommodating space to the outside so that the attachment parts complete the housing and, together with other housing sections, close the accommodating space of the housing to the outside.

When viewed in a plane spanned by the apposition direction and the insertion direction, the attachment parts can, for example, each have a body which provides a planar element which, when viewed along the insertion direction, defines a division of the respective attachment part. For example, the body may have a rectangular basic shape (in a plane spanned by the apposition direction and the insertion direction) with a division corresponding to a predetermined smallest dividing unit or an integer multiple of the predetermined smallest dividing unit. A plurality of attachment parts can be arranged next to one another along the insertion direction and adjacent to one another on the printed circuit board so that the printed circuit board can be populated in a modular manner with different combinations of attachment parts.

In the context of a modular system, a plurality of different attachment parts which can be variably combined with one another in different ways can thus be provided. Because the attachment parts have a division corresponding to a predetermined smallest dividing unit or an integral multiple of the predetermined smallest dividing unit, basically any desired combinations of attachment parts can be arranged next to one another along the insertion direction in such a way that the result is a combination of attachment parts with a predetermined total length corresponding, for example, to the length of a housing opening (measured along the insertion direction) to be closed by the attachment parts. A printed circuit board can thus be populated with quite different combinations of attachment parts in order to be inserted together with the attachment parts into the accommodating space of the housing and thus to form the electronic device.

The use of different attachment parts in combination with one another makes it possible to provide different functions on the printed circuit board as explained below. This thus results in a flexibly usable modular system by means of which quite different electronic devices can be produced in a variable manner and configured in an application-specific manner. The attachment parts can in this case in particular provide a device interface from the printed circuit board construction stage of the manufactured electronic device to the outside.

The predetermined smallest dividing unit (short: TE; English: unit) defines a basic length along the insertion direction. Some attachment parts can, for example, have a division corresponding to the single dividing unit. Other attachment parts can have a division corresponding to twice the dividing unit, i.e., can be twice as long as the dividing unit. Yet other attachment parts can, for example, have a division corresponding to three times the dividing unit. Different attachment parts can thus be combined with one another along the insertion direction in order to create a combination of attachment parts having a predetermined length. For example, if a housing opening into which the combination of attachment parts is to be inserted has a length corresponding to five times the dividing unit, attachment parts can be combined with one another in such a way that the resulting total length corresponds to five times the dividing unit.

The attachment parts are in this case to be arranged on the printed circuit board in such a way that they protrude from the printed circuit board along the apposition direction. While the printed circuit board extends planarly along a plane spanned by the insertion direction and the transverse direction, the attachment parts are arranged on the side edges of the printed circuit board extending along the insertion direction and are perpendicular to the plane of the planarly extending printed circuit board, i.e., along the apposition direction, in relation to the printed circuit board.

For mounting the printed circuit board in the housing, the printed circuit board is populated with a combination of attachment parts and is inserted into the housing together with the attachment parts. In this case, it can preferably be provided that the printed circuit board is fixed in the mounting position (exclusively) by means of the attachment parts in the accommodating space of the housing so that a connection between the printed circuit board and the housing is (only) created indirectly by means of the attachment parts. The printed circuit board is thus secured in the accommodating space of the housing by means of the attachment parts.

The attachment parts can assume quite different functions and be designed to be quite different for this purpose.

For example, an attachment part can provide an aperture part for an electrical connection (electrically) connected to the printed circuit board. For this purpose, the attachment part can have, for example, an opening by means of which a plug connector part can be connected to the electrical connection.

In another embodiment, the attachment part can, for example, implement a clamping device which has one or more plug-in openings into which electrical conductors (for example with stripped line ends) or optical conductors (optical fibers) can be inserted for the purpose of electrical or optical contacting. Such a clamping device can be implemented, for example, as a spring-force clamp or the like. Different clamping devices can have plug-in openings for inserting different electrical conductors with different line cross-sections. Clamping devices of different pole density (i.e., a number of poles per dividing unit corresponding to the number of connections) for connecting different conductors can thus be combined with one another and arranged on the printed circuit board.

However, it is also conceivable and possible for an attachment part to implement a planar wall element (without any further electrical function) for closing the housing to the outside. Such a planar wall element can, for example, provide a closure for the housing. Such a planar wall element can also serve as a so-called spacer in order to provide a spatial separation between electrical components, for example between electrical connections, and to prevent an electrical interaction between the electrical components (in the sense of an enlargement of a creepage path).

In yet another embodiment, the attachment part can also provide a lattice element by means of which cooling for an electronic assembly enclosed in the accommodating space can, for example, be provided.

The attachment parts can also provide operating elements, such as switches (for example, DIP switches), regulators (for example, for a potentiometer), indicators, for example in the form of light-emitting diodes or displays, an electrical fuse or also mechanical or electrical functional elements, for example in the form of a screw connection for fastening the housing to another assembly, for example inside a switchgear cabinet, or also in the form of a shielding support for producing electromagnetic shielding or strain relief for a cable to be secured thereto.

In this case, different attachment parts can have a different coloring which signals an electrotechnical function (such as L/N/PE, EXi, +/−, signal type, safety or the like, which are usually indicated by a specific color code). This has the technical advantage that a subsequent local printing of the housing, as in conventional electronic devices, can be omitted. If a housing of an electronic device is to have a specific coloring or marking in sections, a corresponding attachment part can be used and attached to the housing in order to thus provide a desired coloring or marking.

The electronic device can preferably be combined with other electronic devices by arranging the electronic devices next to one another along the apposition direction and fastening them, for example, to a support rail. For this purpose, the electronic device can have a fastening device, for example in the form of a latching device, by means of which the electronic device can be secured to the support rail.

In an embodiment, the present invention provides a method for producing an electronic device, in which a printed circuit board is inserted along an insertion direction into an accommodating space of a housing formed between two side walls, which are spaced apart from one another along an apposition direction pointing transversely to the insertion direction, and is accommodated in the accommodating space in a mounting position in a position extending perpendicularly to the apposition direction. It is provided in this case that at least one attachment part with at least one engagement receptacle is attached to a side edge of the printed circuit board and, in an attached position, is connected to the printed circuit board.

The advantages and advantageous embodiments described above for the electronic device also apply analogously to the method so that reference is made to the above statements in this regard.

Figure 2:
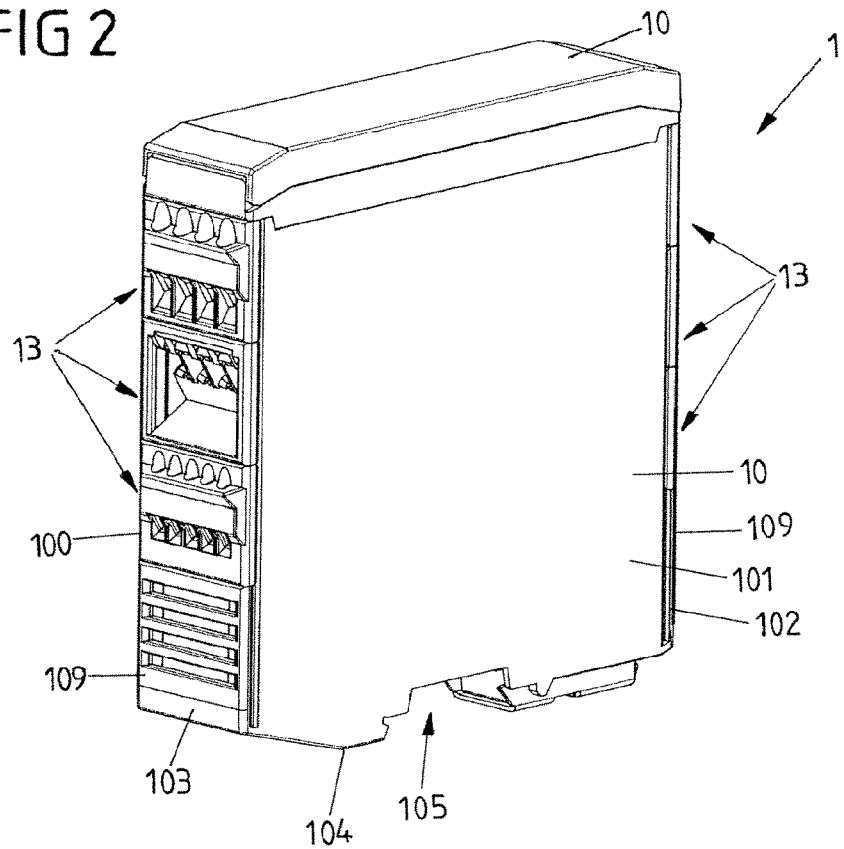
FIG. 2 another perspective view of the electronic device.

FIGS. 1 and 2 show an exemplary embodiment of an electronic device 1 which has a housing 10 and an electronic assembly, enclosed in the housing 10, in the form of a printed circuit board and electronic components arranged thereon. The electronic device 1 can be attached to a support rail 2 by means of a fastening device 105 on a lower side 104 of the housing 10 and can be combined with other electronic devices 1 along an apposition direction T in a manner arranged next to one another.

The housing 10 has two side walls 100, 101 which extend perpendicularly to the apposition direction T and are spaced apart from one another along the apposition direction T as well as end faces 102, 103 which define the substantially cuboidal housing 10. The side walls 100, 101 extend planarly in such a way that other electronic devices 1 can be attached to the electronic device 1 on both sides and can be combined with the electronic device 1 on a support rail 2.

As can be seen from FIGS. 3 to 8, in which different phases in the assembly of the electronic device 1 are shown, the side walls 100, 101 form between them an accommodating space 15, into which a printed circuit board 12 can be inserted in an insertion direction E such that, in a mounting position, the printed circuit board 12 is accommodated in the accommodating space 15 and extends in parallel to the side walls 100, 101. Different electronic components, for example electronic components in the form of electronic circuits, which form an electronic assembly of the electronic device 1 can be arranged on the printed circuit board 12.

Attachment parts 13 which can have different functions and are mounted together with the printed circuit board 12 on the housing 10 are to be arranged on the printed circuit board 12. The attachment parts 13 are arranged on side edges 121, 122 of the printed circuit board 12 extending along the insertion direction E and, in the connected position, protrude from a surface 120 of the printed circuit board 12 along the apposition direction T.

The electronic device 1 can be produced by means of a modular system within the framework of which a combination of attachment parts 13 selected from a plurality of different attachment parts 13 is arranged on the printed circuit board 12 and the printed circuit board 12 with attachment parts 13 arranged thereon is inserted into the housing 10 in order to in particular provide a desired electrical functionality for the electronic device 1.

As can be seen from FIG. 9, quite different attachment parts 13 can be present and form a modular system from which a selection can be made in order to variably populate the printed circuit board 12 and to provide quite different functionalities on the electronic device 1. When viewed along the insertion direction E, the attachment parts 13 each have a division X1, X2, X3, X6, X6 which corresponds to a predetermined smallest division unit X1 or an integral multiple of this predetermined smallest division unit X1. This makes it possible to combine different attachment parts 13 with one another in (almost) any manner in order to provide a desired electrical and/or mechanical function on the printed circuit board 12 and the electronic device 1.

For example, attachment parts 13 in the form of wall elements 13B in the example of FIG. 9 have divisions X1, X2, X3, X6, X9 which differ from one another. A first wall element 13B has, for example, a division X1 corresponding to the predetermined smallest dividing unit X1. In contrast, a second wall element 13B has a division X2 which corresponds to twice the smallest dividing unit X1. Another wall element 13B has a division X3 corresponding to three times the smallest dividing unit X1. Other wall elements 13B have a division X6, X9 corresponding to six or nine times the smallest dividing unit X1.

Likewise, in the example of FIG. 9, the other attachment parts 13 also have a division corresponding to the smallest dividing unit X1 or an integral multiple of the smallest dividing unit X1. In this way, the attachment parts 13 can be variably combined with one another in order to, for example, create a combination of attachment parts 13 with a predetermined overall length which fits precisely into a housing opening 106 of the housing 10 provided for this purpose, as shown, for example, in FIGS. 1 and 2.

As can be seen from FIGS. 3 to 8, the housing 10 has, on each end face 102, 103, a respective housing opening 106 which, in this exemplary embodiment, has a length (measured along the insertion direction E) of nine times the smallest dividing unit X1. Accordingly, precisely three attachment parts 13 with a division X3 corresponding to three times the dividing unit X1 can, for example, be arranged in each housing opening 106, as can be seen, for example, from FIGS. 1 and 2.

Figure 3:
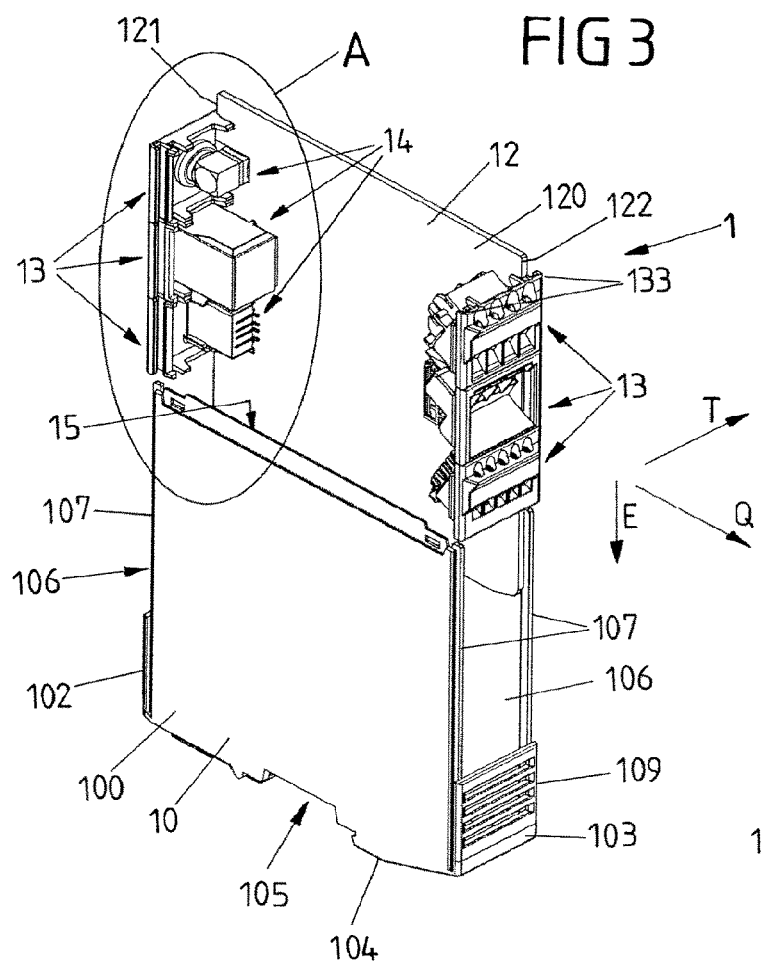
FIG. 3 a view of the electronic device during assembly.

The attachment parts 13 form, for example, aperture parts for connecting devices 14 of the printed circuit board 12 (to the left in FIG. 3) or clamping devices for connecting electrical conductors (to the right in FIG. 3) and are connected to the printed circuit board 12 before inserting the printed circuit board 12 into the accommodating space 15 of the housing 10 so that a pre-assembled structural unit of the printed circuit board 12 with the attachment parts 13 arranged thereon is created, as can be seen, for example, from FIGS. 3 and 5 and 6. The pre-assembled structural unit thus created can then be mounted in the insertion direction E on the housing 10 in that the attachment parts 13 are attached to the side walls 100, 101 of the housing 10 and pushed onto the side walls 100, 101 in the insertion direction E.

The attachment parts 13 each have two first guide devices 133 in the form of a groove, which can be brought into engagement with guide webs 107 on the side edges of the side walls 100, 101 in order to push the attachment parts 13 onto the side walls 100, 101 and thus insert the printed circuit board 12 into the accommodating space 15 of the housing 10.

The accommodating space 15 is formed between the side walls 100, 101 which are spaced apart from one another along the apposition direction T and expose housing openings 106 in the region of the end faces 102, 103 above a lower, fixed wall section 109 in each case. As can be seen from FIG. 7, by pushing the attachment parts 13 with the grooves of the guide devices 133 onto the guide webs 107 of the side walls 100, 101, the attachment parts 13 are pushed between the side walls 100, 101 in such a way that the openings 106 in the region of the end faces 102, 103 are closed and the housing 10 is thus closed at its end faces 102, 103 by the lower, fixed wall sections 109 together with the attachment parts 13 as can be seen from FIG. 8.

After inserting the pre-assembled structural unit consisting of the attachment parts 13 and the printed circuit board 12, the housing 10 is closed by a housing cover 11 so that the printed circuit board 12 cannot fall out of the accommodating space 15 and is thus secured in the accommodating space 15. As can be seen from FIG. 8, the housing cover 11 has a body 110 on which lateral webs 111 are formed which latch with connecting webs 108 on the upper edges of the side walls 100, 101 when the housing cover 11 is attached to the housing 10.

In the mounting position, the printed circuit board 12 is enclosed in the accommodating space 15 of the housing 10. The side walls 100, 101 are laterally connected to one another by means of the attachment parts 13 so that the accommodating space 15 of the housing 10 is closed laterally by means of the attachment parts 13.

Attaching the attachment parts 13 to the side walls 100, 101 of the housing 10 takes place in a guided manner in that the first guide devices 133 of the attachment parts 13 are brought into positive engagement with the second guide devices 107 of the side walls 100, 101 and the attachment parts 13 are displaced in the insertion direction E in a guided manner in relation to the side walls 100, 101. As can be seen, for example, from the enlarged view of FIG. 4 in conjunction with FIG. 12, the guide devices 133 of the attachment parts 13 are formed by grooves which extend longitudinally along the insertion direction E and provide an engagement between a respectively associated guide web 107 on the side edge of an associated side wall 100, 101 in such a way that a fixed connection between the attachment parts 13 and the side walls 101, 101 in a plane perpendicular to the insertion direction E is created, but the attachment parts 13 are displaceable along the insertion direction E in relation to the side walls 100, 101. For this purpose, each guide device 133 has a blocking web 138 which is formed on the rear side of the groove and extends along the insertion direction E and ensures the engagement of an associated guide web 107 in the groove of the guide device 133 such that the guide web 107 cannot come out of engagement with the groove of the guide device 133 along the transverse direction Q.

Figure 12:
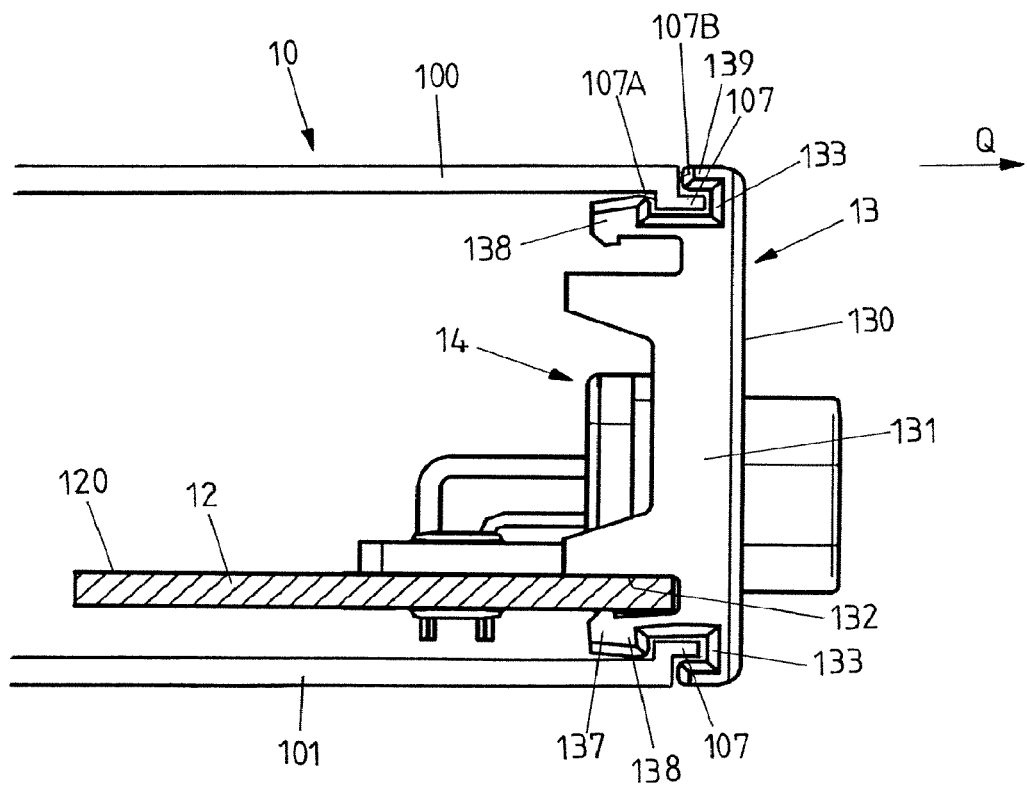
FIG. 12 a view of the printed circuit board with attached attachment part.

Each guide web 107 forms steps 107A, 107B to the associated side wall 100, 101, which steps are in contact with the blocking web 138 and with an outer boundary section 139 of the groove of the guide device 133 so that the guide web 107 is held in a sliding manner in the guide device 133 of the associated attachment part 13 and cannot, when viewed in a plane transverse to the insertion direction E, come out of the groove, as shown in FIG. 12. There is thus a positive engagement for the guide web 107 in the groove of the guide device 133, as a result of which the guide web 107 is positively (but displaceably along the insertion direction E) held in the guide device 133.

This embodiment of the guide devices 133 and the guide webs 107 has the effect that the attachment parts 13 can be pushed onto the side walls 100, 101 in a defined manner. This also has the effect that, in the mounting position, a firm connection is established between the attachment parts 13 and the side walls 100, 101, which connection is robust and reliably prevents (undesired) release of the attachment parts 13 from the side walls 100, 101.

Figure 4:
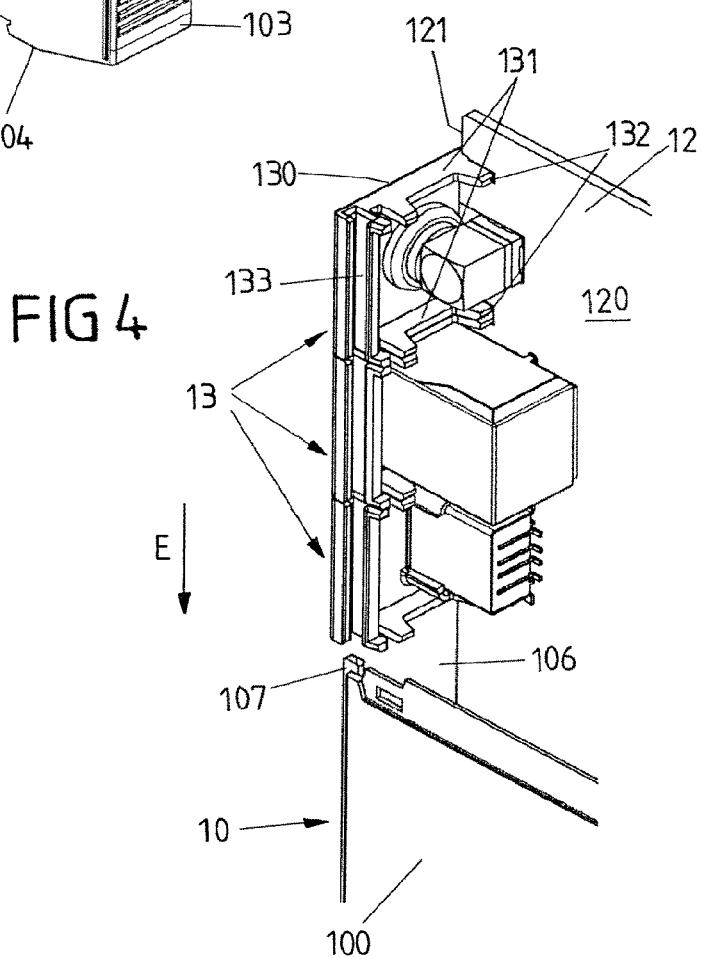
FIG. 4 an enlarged sectional view in detail A of FIG. 3.

As can be seen, for example, from FIGS. 3 and 4, a plurality of neighboring attachment parts 13 which are adjacent to one another along the insertion direction E are arranged on both sides of the printed circuit board 12 on the side edges 121, 122. The attachment parts 13 each have a body 130 which has a square basic shape (when viewed in a plane spanned by the insertion direction E and the apposition direction T) so that different attachment parts 13 can be combined with one another and arranged on the printed circuit board 12 in a modular manner.

The attachment parts 13 are part of a modular system and can be selected in a desired combination in order to produce an electronic device 1 with intended functionality. In this case, the attachment parts 13 can assume quite different functions and can be designed to be quite different, as shown in an overview representation in FIG. 9.

Figure 10:
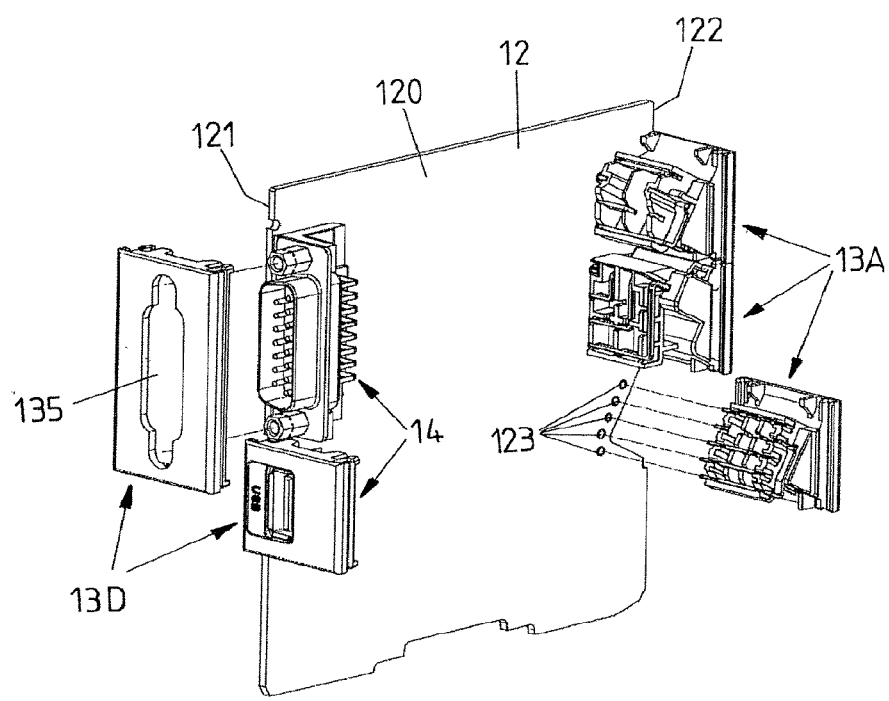
FIG. 10 a view of a printed circuit board with attachment parts arranged thereon.

Attachment parts 13 can thus be designed as clamping devices 13A, which have, for example, plug-in opening 134 into which electrical conductors (with stripped conductor ends) can be inserted in order to connect the electrical conductors to an associated printed circuit board 12. By means of electrical contact pins 136, the clamping devices 13A can be arranged at contact openings 123 of the printed circuit board 12 (see FIG. 10) in order to electrically and mechanically secure the clamping devices 13A to the printed circuit board 12. The clamping devices 13A can be implemented, for example, as spring-force connections or the like and allow for (simple) connection of electrical conductors.

Different clamping devices 13A can have differently dimensioned plug-in openings 134 for receiving conductors of different line cross-sections, as can be seen from FIG. 9. Thus, the clamping device 13A shown at the top in FIG. 9 and the clamping device 13A shown at the bottom in FIG. 9 have differently dimensioned plug-in openings 134 for inserting conductors with different conductor cross-sections.

In an alternative embodiment, attachment parts 13 may also be designed as wall elements 13B which provide a planar closure for the housing 10 and may have different sizes.

In yet an alternative embodiment, attachment parts 13 may provide lattice elements 13C by means of which cooling for an electronic assembly enclosed in the housing 10 may, for example, be provided.

In yet another embodiment, the attachment parts 13 can implement aperture parts 13D which can be attached to electrical connecting devices 14, for example plug connectors for providing a coaxial connection, a network connection, a USB connection or a parallel or serial interface. The aperture parts 13D have openings 135 by means of which it is possible to connect plug connectors to the connecting devices 14.

Other embodiments of attachment parts 13 are also conceivable. For example, the attachment parts 13 can provide operating elements 13F (for example, switches), indicators 13E (LEDs, displays) or also mechanical functional components 13G, for example with an outward protruding screw flange 16 for fixing the housing 10 to an external structural unit or the like.

The attachment parts 13 are to be arranged on the printed circuit board 12 in order to in this way create a pre-assembled structural unit which can be mounted on the housing 10 in order to complete the electronic device 1. In the exemplary embodiment of FIG. 10, attachment parts 13 in the form of clamping devices 13A are connected to the printed circuit board 12 in that contact pins 136 are inserted into associated contact openings 123 (see FIGS. 9 and 10 at the) and soldered to the printed circuit board 12, for example, so that an electrical and mechanical connection to the printed circuit board 12 is created.

In contrast, other attachment parts 13 (aperture parts 13D in the exemplary embodiment of FIG. 10) are connected non-positively or positively to the printed circuit board 12. As can be seen from FIGS. 3 and 4 in conjunction with FIGS. 11 to 15, such attachment parts 13 have engagement receptacles 132 on webs 131 with which each attachment part 13 can be plugged onto an associated side edge 121, 122 of the printed circuit board 12 as can be seen, for example, from the transition from FIG. 11 to FIG. 12. A fixing lug 137 is formed on the attachment part 13 and during attachment brings about a non-positive or positive connection.

Figure 11:
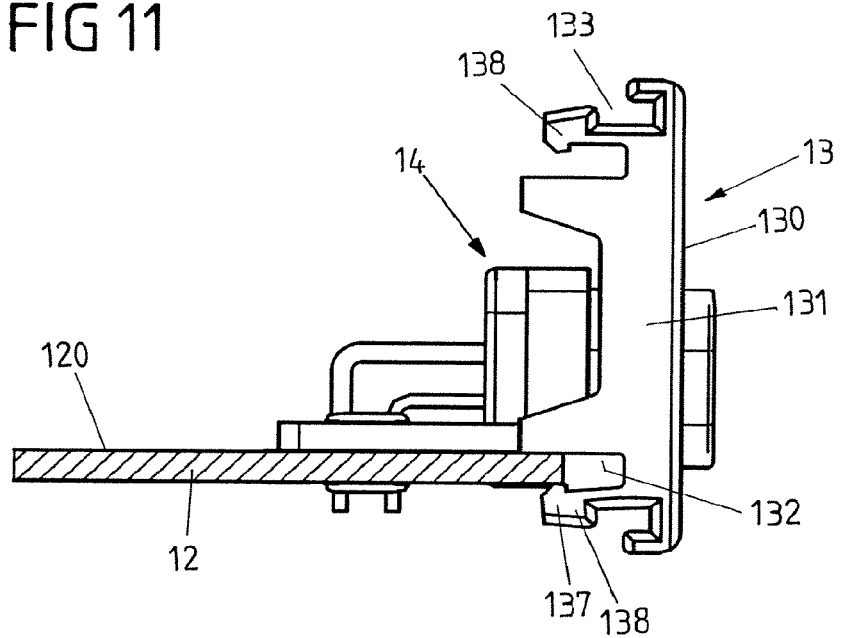
FIG. 11 a view of a printed circuit board when attaching an attachment part to the printed circuit board.

For example, in the exemplary embodiment of FIGS. 11 and 12, the associated side edge 121, 122 of the printed circuit board 12 is accommodated in a clamping manner in the engagement receptacles 132 in that the fixing lugs 137 of the engagement receptacles 132 press against the printed circuit board 12 (under slight deformation) and thus establish a non-positive connection.

Figure 15:
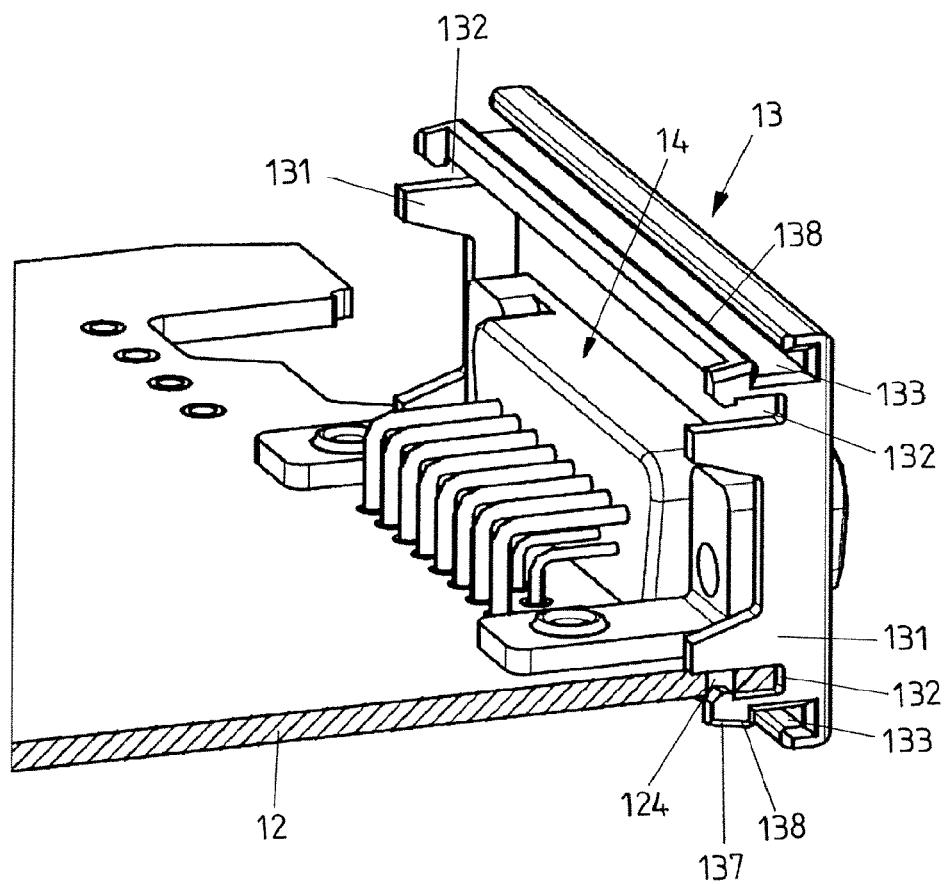
FIG. 15 a perspective, partially sectional view of the printed circuit board, with the attached attachment part according to the view of FIG. 14.

In contrast, in the exemplary embodiment of FIGS. 13 to 15, the fixing lugs 137 engage in associated latching openings 124 of the printed circuit board 12 after the respective attachment part 13 has been attached to the printed circuit board 12 so that a positive connection is produced, as a result of which the attachment part 13 is held on the printed circuit board 12. Each fixing lug 137 snaps into engagement with an associated latching opening 124 of the printed circuit board 12 when the attachment part 13 is attached to the associated side edge 121, 122 of the printed circuit board 12 so that in the attached position, a latching, positive connection is created between the attachment part 13 and the printed circuit board 12 as can be seen from the transition from FIG. 13 to FIG. 14 and also in FIG. 15.

The respective attachment part 13 can thus easily be arranged on the printed circuit board 12 and is connected non-positively or positively to the printed circuit board 12 in the attached position.

In another embodiment, a fixing lug 137 may optionally also be omitted. In this case, the engagement receptacles 132 form, for example, an interference fit with the associated side edge 121, 122 of the printed circuit board 12 in that the engagement receptacles 132 (when viewed along the apposition direction T) have a clear width which is smaller than the wall thickness of the printed circuit board 12 in the region of the associated side edge 121, 122 so that the attachment part 13 can be pressed against and attached to the associated side edge 121, 122 and is held non-positively on the side edge 121, 122 in the attached position.

If the assembly formed from the printed circuit board 12 and the attachment parts 13 is then attached to the housing 10, the position of the attachment parts 13 on the printed circuit board 12 is additionally fixed by positive connection with the housing 10, and the printed circuit board 12 is held in position in the housing 10 by means of the attachment parts 13.

Because the attachment parts 13 can easily be attached to an associated side edge 121, 122 of the printed circuit board 12 and, in the attached position, are connected non-positively or positively to the printed circuit board 12, easy assembly for arranging the attachment parts 13 on the printed circuit board 12 results. In particular, assembly can be carried out without tools in that the attachment parts 13 with their engagement receptacles 132 are respectively brought into engagement with an associated side edge 121, 122 of the printed circuit board 12 and plugged onto the side edge 121, 122 so that a non-positive or positive connection is established.

The engagement receptacles 132 are formed in the shape of slots. The engagement receptacles 132 of each attachment part 13 are formed on webs 131 which are spaced apart from one another along the insertion direction E and protrude transversely to the body 130 of the attachment part 13. As can be seen from FIG. 4, for example, the attachment part 13 is thus non-positively or positively secured to the associated side edge 121, 122 of the printed circuit board 12 by means of two engagement receptacles 132 offset in relation to one another along the insertion direction E.

A latching hook 137 is formed in the region of each engagement receptacle 132. When attaching the attachment part 13 to the associated side edge 121, 122 of the printed circuit board 12, the latching hooks 137 are deflected (slightly) and, after reaching the attached position (FIGS. 14 and 15), snap into engagement with latching openings 124 of the printed circuit board 120 so that the attachment part 13 is non-positively or positively secured to the printed circuit board 12.

Figure 16:
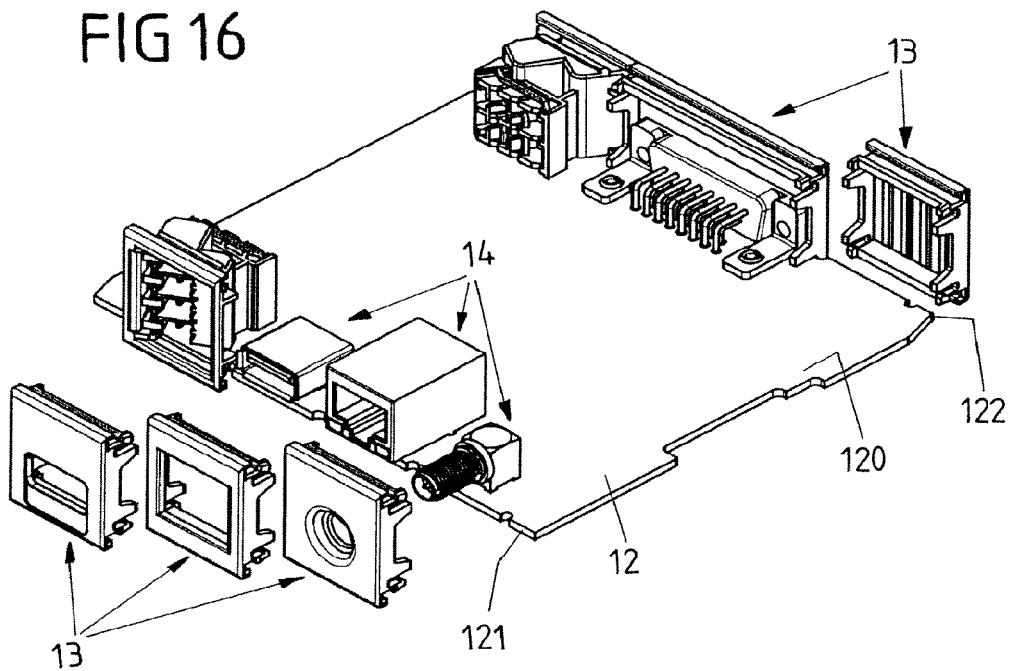
FIG. 16 a view of a printed circuit board with attachment parts to be attached thereto.
Figure 17:
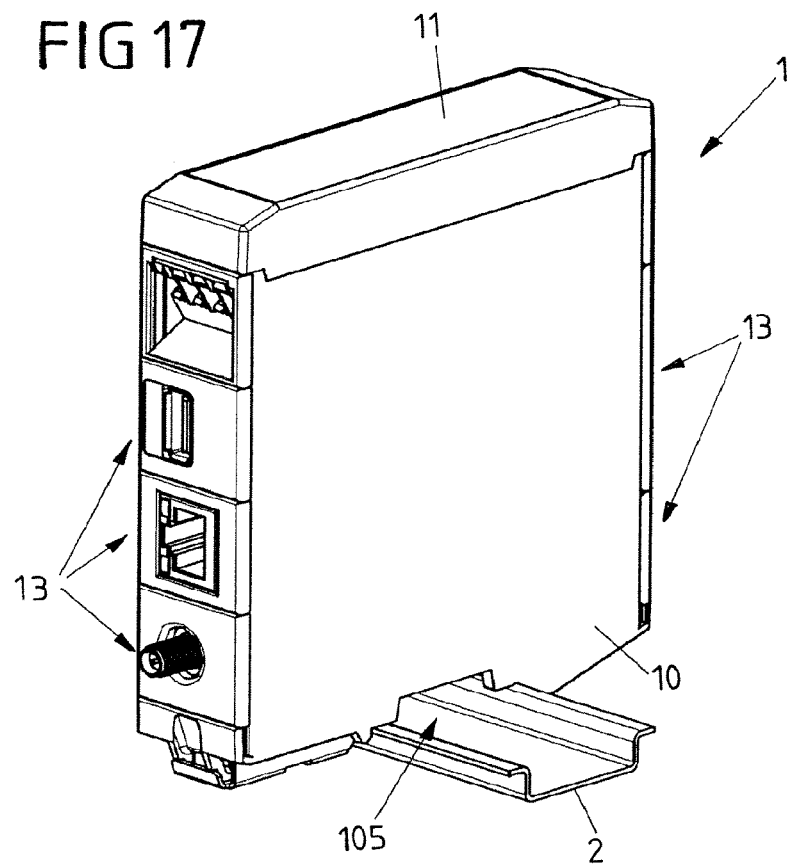
FIG. 17 a view of an electronic device with mounted printed circuit board and attachment parts.

FIGS. 16 and 17 show another exemplary embodiment of a printed circuit board 12 with attachment parts 13 to be attached thereto. The attachment parts 13 can serve as aperture parts for connecting devices 14 in the form of different plug connectors but can also provide, for example, a housing element or a lattice element.

Figure 18:
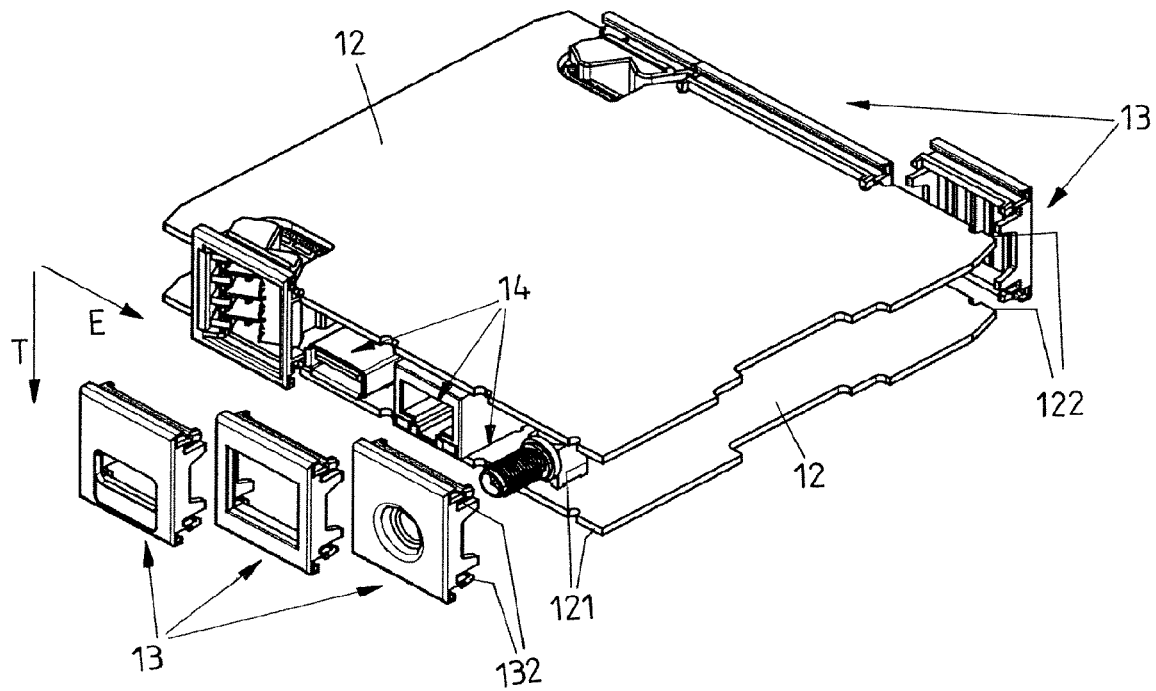
FIG. 18 a view of an exemplary embodiment with two printed circuit boards and attachment parts to be attached thereto.
Figure 19:
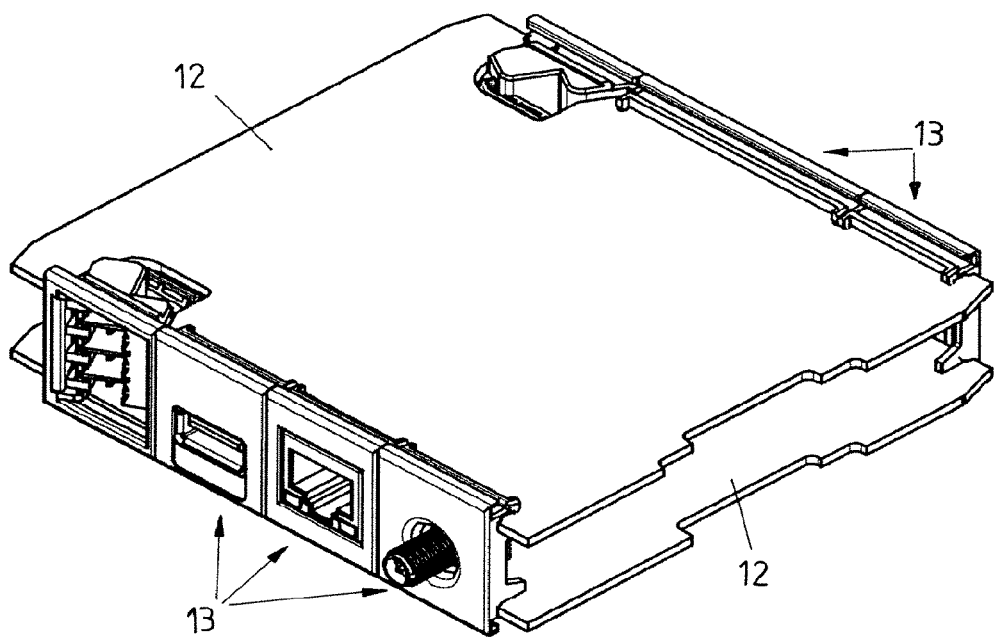
FIG. 19 a view of the exemplary embodiment of FIG. 18 with attached attachment parts.
Figure 20:
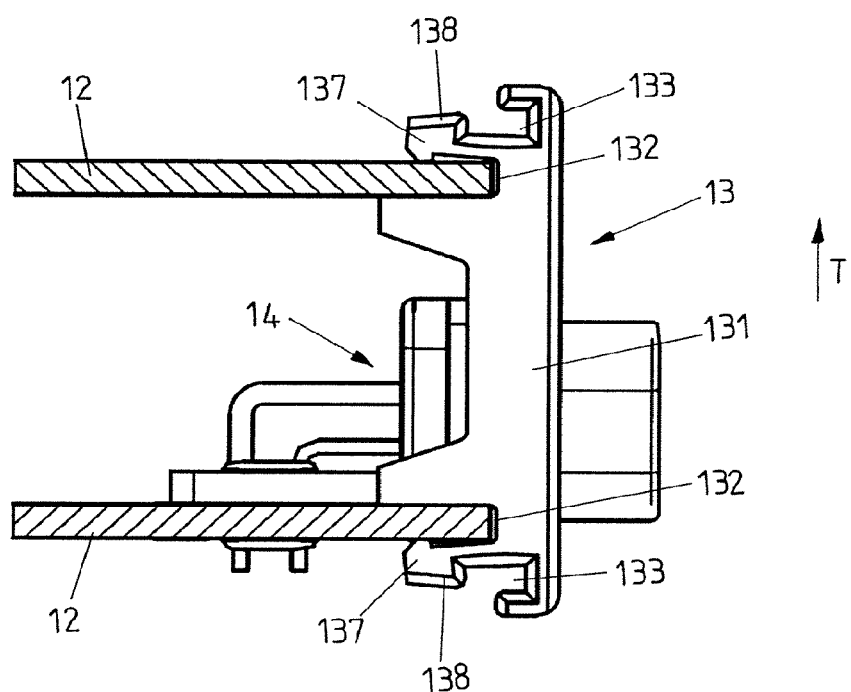
FIG. 20 a partial sectional view of the arrangement of FIG. 19 in the region of side edges of the printed circuit boards.

In the exemplary embodiments shown, each attachment part 13 has engagement receptacles 132 which are formed on the webs 131 at an offset relative to one another transversely to the insertion direction E, namely along the apposition direction T. This makes it possible, as shown in FIGS. 18 to 20, to connect two printed circuit boards 12 extending in parallel to one another by means of the attachment parts 13 so that a pre-assembled structural unit comprising the two printed circuit boards 12 is created, which as such can be mounted in the accommodating space 15 of the housing 10.

In order to create the pre-assembled structural unit with its engagement receptacles 132 offset in relation to one another transversely to the insertion direction E, namely along the apposition direction T, the attachment parts 13 are non-positively or positively attached to associated side edges 121, 122 of the printed circuit boards 12 aligned in parallel to one another and in this way enter into a non-positive or positive connection with the printed circuit boards 12. In the attached position (FIG. 19), the printed circuit boards 12 are firmly connected to one another by means of the attachment parts 13 and can thus be mounted together in the accommodating space 15 of the housing 10. In the mounting position, the printed circuit boards 12 are then fixed in the accommodating space 15 of the housing 10 by means of the attachment parts 13 and are held in position in a load-bearing manner both in relation to one another and to the housing 10.

The idea behind the invention is not limited to the exemplary embodiments above but can also be implemented in a completely different manner.

An electronic device of the type described here can assume quite different functions, for example for controlling electrical machines, for evaluating sensor signals, for providing a power supply or the like. In doing so, an electronic device of the type described here can be combined with other electrical or electronic assemblies on a support rail so that a complex electrical system can be created, for example, in a switchgear cabinet.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS

1 Electronic device
10 Housing
100, 101 Side wall
102, 103 End face
104 Underside
105 Fastening device
106 Opening
107 Guide edge
107A, 107B Steps
108 Connecting web
109 Wall section
11 Housing cover
110 Body
111 Web
12 Printed circuit board
120 Surface
121, 122 Side edge
123 Contact openings
124 Latching opening
13, 13A-13G Attachment part
130 Body
131 Web
132 Engagement receptacle
133 Guide device
134 Plug-in opening
135 Opening
136 Contact pins
137 Fixing lug
138 Blocking web
139 Boundary web
14 Connecting device
15 Accommodating space
16 Screw flange
2 Support rail
E Insertion direction
Q Transverse direction
T Apposition direction
X1, X2, X3, X6, X9 Division

The invention claimed is:

1. An electronic device, comprising:
 a housing which has two side walls which are spaced apart from one another along an apposition direction and form an accommodation space between them;
 a printed circuit board which is insertable into the accommodating space of the housing along an insertion direction pointing transversely to the apposition direction and, in a mounting position, is accommodated in the accommodating space in a position perpendicular to the apposition direction and has a side edge extending along the insertion direction; and
 at least one attachment part which has at least one engagement receptacle by which the at least one attachment part is attachable to the side edge of the printed circuit board and, in an attached position, is connected to the printed circuit board,
 wherein the at least one attachment part has two first guide devices configured to guide on second guide devices of the side walls, and
 wherein the at least one attachment part is integral with the printed circuit board and mountable together with the printed circuit board on the housing such that when the printed circuit board is inserted into the accommodating space, the at least one attachment part is displaceably guided along the insertion direction by the first guide devices on the second guide devices of the side walls of the housing and, in the mounting position, positively connects the side walls to one another.

2. The electronic device according to claim 1, wherein the at least one engagement receptacle is formed in a shape of a slot on the at least one attachment part.

3. The electronic device according to claim 1, wherein the at least one attachment part has a latching hook configured to engage in a latching opening of the printed circuit board.

4. The electronic device according to claim 1, wherein the at least one attachment part has a plurality of engagement receptacles, spaced apart from one another transversely to the insertion direction, configured to connect the at least one attachment part to a plurality of printed circuit boards which extend in parallel to one another and are insertable into the housing.

5. The electronic device according to claim 1, wherein, for assembling the housing, the first guide devices and the second guide devices are configured to be brought into engagement with one another such that the at least one attachment part is firmly connected to the side walls in a plane extending perpendicularly to the insertion direction but is displaceable along the insertion direction in relation to the side walls.

6. The electronic device according to claim 1, wherein each first guide device is configured to be brought into positive engagement with an associated second guide device by engaging a web in a groove.

7. The electronic device according to claim 6, wherein the first guide devices each have a blocking web which delimits the groove along a transverse direction extending perpendicularly to the insertion direction and perpendicularly to the apposition direction such that the associated web is held in engagement with the groove along the transverse direction.

8. The electronic device according to claim 1, wherein the second guide devices each have a web and the first guide devices each have a groove which is configured be brought into engagement with the web of an associated second guide device.

9. The electronic device according to claim 1, wherein, in the mounting position, the at least one attachment part extends between the side walls along the apposition direction.

10. The electronic device according to claim 1, wherein, in the mounting position, the at least one attachment part forms a boundary for the accommodating space to the outside.

11. The electronic device according to claim 1, wherein the printed circuit board is fixed in the mounting position by the at least one attachment part in the accommodating space of the housing.

12. The electronic device according to claim 1, wherein the at least one attachment part forms:
 an aperture part for an electrical connection electrically connected to the printed circuit board;
 a clamping device with at least one plug-in opening configured to connect an electrical conductor;
 a closed, planar wall element configured to close the housing; or
 a lattice element.

13. The electronic device according to claim 1, further comprising a fastening device configured to connect the electronic device to a support rail.

14. The electronic device according to claim 1, wherein the at least one attachment part has a body which, when viewed along the insertion direction, defines a division corresponding to a predetermined smallest dividing unit or an integral multiple of the predetermined smallest dividing unit such that a combination of attachment parts is connectable to the printed circuit board in a manner arranged next to one another along the insertion direction.

15. A method for producing an electronic device, comprising:
- inserting a printed circuit board along an insertion direction into an accommodating space of a housing formed between two side walls which are spaced apart from one another along an apposition direction pointing transversely to the insertion direction,
- wherein, in a mounting position, the printed circuit board is accommodated in the accommodating space in a position extending perpendicularly to the apposition direction,
- wherein least one attachment part having at least one engagement receptacle is attached to a side edge of the printed circuit board and, in an attached position, is connected to the printed circuit board,
- wherein the at least one attachment part has two first guide devices configured to guide on second guide devices of the side walls, and
- wherein the at least one attachment part is integral with the printed circuit board and mountable together with the printed circuit board on the housing such that when the printed circuit board is inserted into the accommodating space, the at least one attachment part is displaceably guided along the insertion direction by the first guide devices on the second guide devices of the side walls of the housing and, in the mounting position, positively connects the side walls to one another.

* * * * *